(12) United States Patent
Zhang et al.

(10) Patent No.: US 10,096,691 B2
(45) Date of Patent: Oct. 9, 2018

(54) METHODS FOR FORMING METAL SILICIDE

(71) Applicant: INSTITUTE OF MICROELECTRONICS, CHINESE ACADEMY OF SCIENCES, Beijing (CN)

(72) Inventors: Qingzhu Zhang, Beijing (CN); Lichuan Zhao, Beijing (CN); Xiongkun Yang, Beijing (CN); Huaxiang Yin, Beijing (CN); Jiang Yan, Beijing (CN); Junfeng Li, Beijing (CN); Tao Yang, Beijing (CN); Jinbiao Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 0 days.

(21) Appl. No.: 14/812,490

(22) Filed: Jul. 29, 2015

(65) Prior Publication Data

US 2016/0268391 A1   Sep. 15, 2016

(30) Foreign Application Priority Data

Mar. 13, 2015   (CN) .......................... 2015 1 0112597

(51) Int. Cl.
*H01L 29/66* (2006.01)
*H01L 21/265* (2006.01)
*H01L 29/167* (2006.01)
*H01L 29/417* (2006.01)
*H01L 21/28* (2006.01)

(52) U.S. Cl.
CPC ...... *H01L 29/665* (2013.01); *H01L 21/26513* (2013.01); *H01L 21/26586* (2013.01); *H01L 21/28097* (2013.01); *H01L 29/167* (2013.01); *H01L 29/41791* (2013.01); *H01L 29/66795* (2013.01)

(58) Field of Classification Search
CPC .................. H01L 29/66795; H01L 21/823431
See application file for complete search history.

(56) References Cited

U.S. PATENT DOCUMENTS

| | | | | |
|---|---|---|---|---|
| 6,630,399 B2 * | 10/2003 | Van De Ven | ....... | H01L 21/0206 257/E21.165 |
| 2002/0111018 A1 * | 8/2002 | Tai | .................... | H01L 21/28518 438/655 |
| 2005/0064636 A1 * | 3/2005 | Cabral, Jr. | ........ | H01L 21/28052 438/184 |

(Continued)

*Primary Examiner* — Fernando L Toledo
*Assistant Examiner* — Valerie N Newton
(74) *Attorney, Agent, or Firm* — Christensen, Fonder, Dardi & Herbert PLLC (57) ABSTRACT

A method for forming a metal silicide. The method comprises: providing a substrate having a fin, a gate formed on the fin, and spacers formed on opposite sides of the gate; depositing a Ti metal layer; siliconizing the Ti metal layer; and removing unreacted Ti metal layer. As the Ti atoms have relatively stable characteristics, diffusion happens mostly to Si atoms while the Ti atoms rarely diffuse during the thermal annealing. As a result, current leakage can be prevented in a depletion region and thus leakage current of the substrate can be reduced.

9 Claims, 6 Drawing Sheets

(56) References Cited

U.S. PATENT DOCUMENTS

| | | | |
|---|---|---|---|
| 2006/0019437 A1* | 1/2006 | Murto | H01L 21/823842 438/199 |
| 2009/0095980 A1* | 4/2009 | Yu | H01L 29/66795 257/190 |
| 2011/0127610 A1* | 6/2011 | Lee | H01L 21/823431 257/365 |
| 2012/0098042 A1* | 4/2012 | Cai | H01L 21/2257 257/288 |
| 2015/0332964 A1* | 11/2015 | Cheng | H01L 29/785 257/288 |

* cited by examiner

METHODS FOR FORMING METAL SILICIDE

RELATED APPLICATION

The present application claims priority to Chinese Patent Application No. 201510112597.3 filed Mar. 13, 2015, the disclosure of which is hereby incorporated by reference herein in its entirety.

TECHNICAL FIELD

The present disclosure relates to the field of semiconductor device manufacturing, and in particular, to a method for forming a metal silicide.

BACKGROUND

With increasing integration of semiconductor devices, channel lengths decrease continuously for MOSFETs. A series of effects that are negligible in a long channel model of the MOSFET become increasingly obvious, or even become dominant factors influencing performances of the devices. These effects are generally referred to as a short channel effect, which may deteriorate electrical performances of the devices. For example, the short channel effect may cause problems such as gate threshold voltage decrease, power consumption increase, and signal-to-noise ratio degradation, or the like.

Fully-depleted non-planar devices, such as Fin Field-Effect Transistors (FinFETs) are ideal for devices at 20 nm or even smaller dimensions. The FinFET is a novel design developed from conventional standard transistors, e.g., Field-Effect Transistors (FETs). In the FinFET, certain surfaces of a fin are used as a channel, whereby avoiding the short channel effect in the conventional transistor while increasing its working current.

Figure 1:
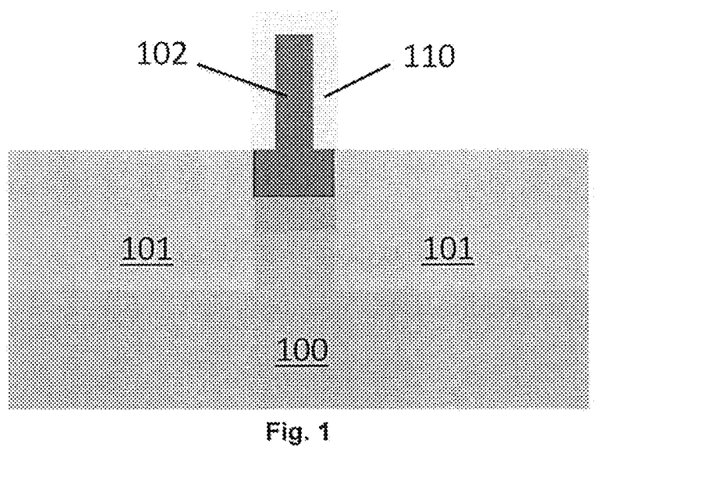
FIGS. 1 and 2 are cross-sectional views schematically showing sectional views of a FinFET device in a process of forming the device using a metal siliconization process in the related art.
Figure 2:
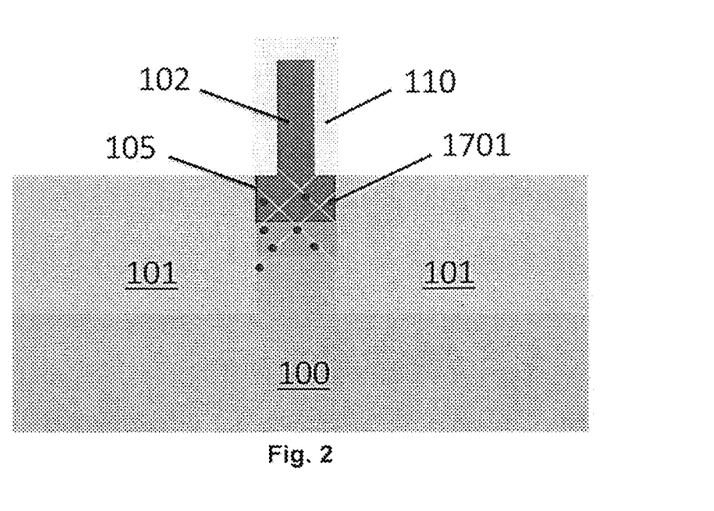

Metal siliconization process of Ni or NiPt alloy is often used in manufacturing the traditional FinFET. As shown in FIG. 1, a Ni (Pt) silicide 110 is formed on a source/drain region to reduce a square resistance and an ohm contact resistance of the device. However, amorphous boundaries and dislocation lines 105 may be generated in a fin 102 during source/drain implementation and annealing. In the process of forming silicide, as shown in FIG. 2, Ni (Pt) ions 1701 diffuse along the dislocation lines 105 to form many discrete NiSi dots in a depletion region. When a voltage is applied, strong electric-field intensity is generated in the depletion region, causing conductive paths between these discrete dots. Consequently, a large leakage current flows toward the substrate, thereby degrading the performance of the device.

SUMMARY

The present disclosure provides a method for forming a metal silicide, which may avoid the large leakage current between the fin and the substrate in the conventional method.

The present disclosure provides a method for forming a metal silicide, comprising:
providing a substrate having a fin, a gate formed on the fin, and spacers formed on opposite sides of the gate;
depositing a titanium (Ti) metal layer;
siliconizing the Ti metal layer; and
removing unreacted Ti metal layer.

Optionally, siliconizing the Ti metal layer and removing the unreacted Ti metal layer comprises:
conducting a first thermal annealing;
removing the unreacted Ti metal layer; and
conducting a second thermal annealing at a temperature higher than that for the first thermal annealing.

Optionally, the first thermal annealing is conducted at the temperature of 600-700° C. for 20-40 seconds.

Optionally, the second thermal annealing is conducted at the temperature of 800-900° C. for 7-13 seconds.

Optionally, the method further comprises, after the second thermal annealing, conducting ion implantation with a dopant of the same type as that for a source/drain region and conducting a further annealing.

Optionally, the dopant is As for an N-type device. The ion implantation is conducted with an implantation dosage in a range of 1E14 $cm^{-2}$ to 5E14 $cm^{-2}$ and implantation energy in a range of 5 KeV to 15 KeV, and at an implantation angle in a range of 0° to 45° with respect to a direction perpendicular to the fin.

Optionally, the dopant is $BF_3$ for a P-type device. The ion implantation is conducted at an implantation dosage in a range of 1E14 $cm^{-2}$ to 5E14 $cm^{-2}$ and implantation energy in a range of 2.5 KeV to 10 KeV, and at an implantation angle in a range of 0° to 45° with respect to a direction perpendicular to the fin.

Optionally, the further annealing is conducted at a temperature of 550-700° C. for 20-40 seconds.

According to the method for forming the metal silicide of the present disclosure, the Ti metal layer is first deposited on the substrate having the fin, the gate formed thereon, and the spacers formed on the opposite sides of the gate, and then the Ti metal layer is siliconized by annealing. The unreacted Ti metal layer is removed to complete the manufacturing of the metal silicide. Ti atoms have relatively stable characteristics, and thus in the process of thermal annealing, diffusion happens mostly to Si atoms while the Ti atoms rarely diffuse. As a result, current leakage due to metal diffusion can be avoided in the depletion region, so that a leakage current of the substrate can be reduced.

Furthermore, the Ti silicide formed by the dual-annealing process has a small resistance, and thus there is no need to reduce a parasitic resistance of the source/drain region by epitaxy of GeSi, which simplifies the process of manufacturing and improves the performance of the device.

Also, the ion implantation is conducted after the siliconization, which may further reduce the contact resistance between the silicide and the fin.

BRIEF DESCRIPTION OF THE DRAWINGS

Next, the accompanying drawings will be described briefly in order to more clearly describe the technical solutions in the embodiments of the present disclosure or in the related art. Obviously, the accompanying drawings described below are merely some embodiments recited in the present disclosure. Other embodiments will be readily apparent to those skilled in the art in light of these accompanying drawings.

DETAILED DESCRIPTION

The embodiments of the present disclosure will be described in detail below. Examples of the embodiments are illustrated in the accompanying drawings, throughout which the same or similar reference signs represent the same or similar elements or elements having the same or similar functions. The embodiments described below with reference to the accompanying drawings are illustrative, and are merely used for explaining the present disclosure instead of limiting the same.

Also, the present disclosure is described in detail in conjunction with schematic diagrams. When the embodiments of the present disclosure are described in detail, for convenience of description, sectional diagrams representing structures of devices will not be drawn to scale, and may be locally enlarged. In addition, the diagrams are merely examples, instead of limiting the protection scope of the present disclosure. Further, in practical manufacturing, three-dimensional sizes, i.e., length, width, and depth should be included.

Figure 3:
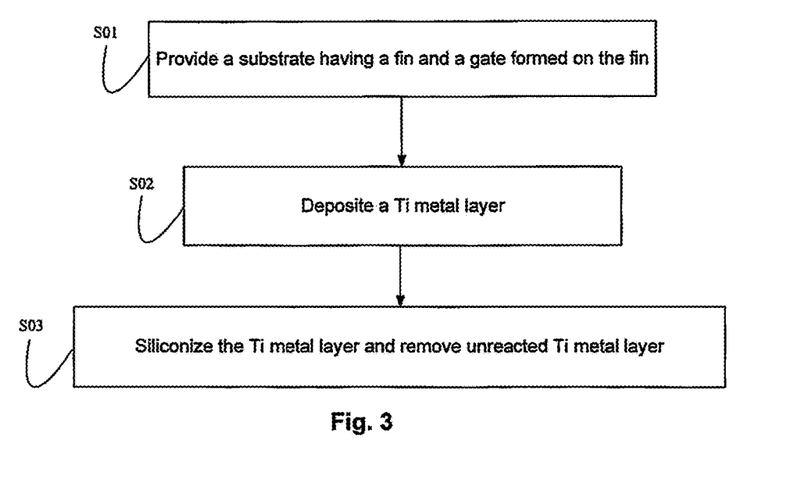
FIG. 3 is a flowchart of a method for forming a metal silicide according to an embodiment of the present disclosure.

For better understanding of the technical solutions and technical effects of the present disclosure, specific embodiments will be described in detail in conjunction with the flowchart of the method according to the present disclosure. As shown in FIG. 3, the method according to the present disclosure comprises the following steps.

Figure 4A:
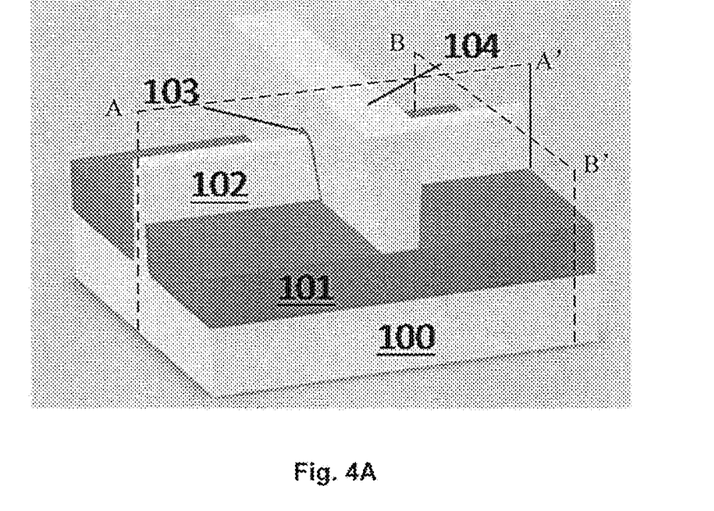
FIG. 4A is a perspective view schematically showing a FinFET before the metal siliconization process according to an embodiment of the present disclosure, wherein spacers on opposite sides of a gate are not shown.
Figure 4B:
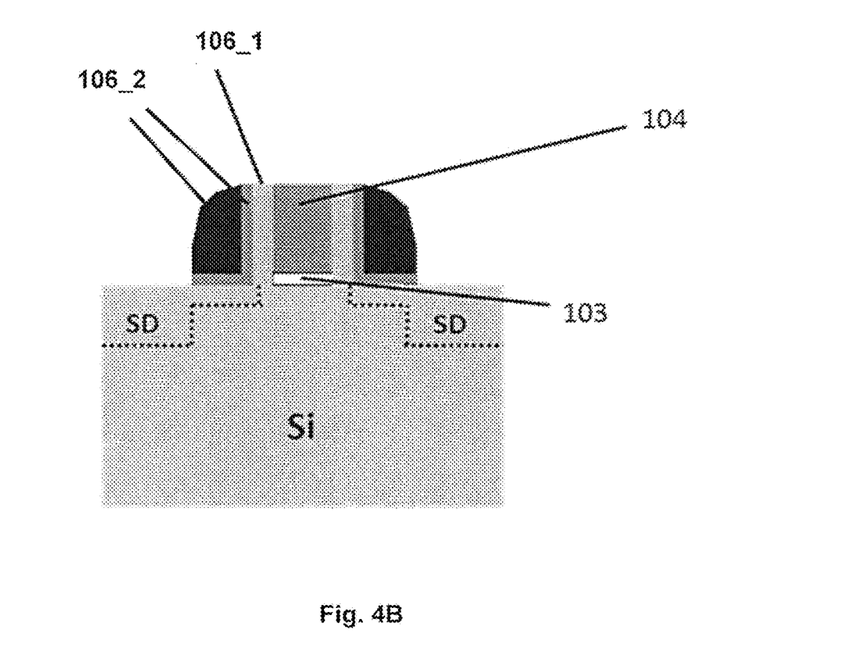
FIG. 4B is a cross-sectional view taken along an A-A' line of the FinFET shown in FIG. 4A, wherein the spacers on opposite sides of a gate are shown.
Figure 5:
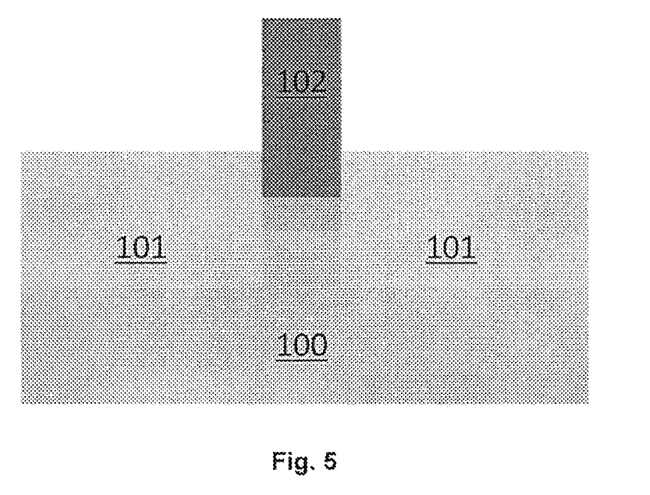
FIGS. 5-9 are cross-sectional views, taken along a B-B' line as shown in FIG. 4A, which schematically show the FinFET in the method for forming metal silicide according to an embodiment of the present disclosure.

First, in step S01, a substrate 100 having a fin 102 and a gate 104 formed thereon is provided, wherein the gate 104 is formed on the fin 102, as shown in FIGS. 4A and 5. Optionally, spacers 106_1 and 106_2 may be formed on opposite sides of the gate 104, as shown in FIG. 4B.

In an embodiment of the present disclosure, the substrate 100 may be a silicon (Si) substrate, a Silicon on Insulator (SOI) substrate, or the like. In other embodiments, the substrate 100 may also be a substrate including other silicon compound semiconductors, for example, silicon carbide (SiC), or the like. The substrate 100 may also have a stacked structure, for example, a Si/silicon germanium (SiGe) stack, or the like. In the present embodiment, the substrate 100 is a bulk Si substrate.

In the present embodiment, the fin and the gate are formed by the following steps.

First, a first hard mask, such as a $Si_3N_4$ mask, is formed on the bulk Si substrate 100. Then, the substrate 100 is etched by, e.g., reactive ion etching (RIE), to form the fin 102. In this way, the fin 102 is formed on the substrate 100.

Next, an isolation layer 101 is formed using an isolation material such as $SiO_2$, and is then planarized until an upper surface of the fin 102 is exposed. Then, a certain thicknesses of the $SiO_2$ layer is removed using wet etching, for example, hydrofluoric (HF) acid etching, to retain a part of the isolation material between the fin 102 and a neighboring fin thereof. Thus, the isolation layer 101 is formed, as shown in FIGS. 4A and 5.

Then, a gate dielectric layer 103 and a gate layer 104 are formed on the fin 102 and the isolation layer 101. The gate dielectric layer may be a film comprising, e.g., $SiO_2$ or $H_fO_x$, or the like, which are suitable for the gate dielectric layer of the FinFET. The gate layer may comprise one or more layers of metal, polysilicon, or a combination thereof. The metal material may be any one selected from a group consisting of, for example, Ti, $TiAl_x$, TiN, $TaN_x$, HfN, $TiC_x$, $TaC_x$, or the like.

Then, the gate layer 104 and the gate dielectric layer 103 are etched along a direction perpendicular to the fin 102 until the isolation layer 101 and the fin 102 are exposed to form the gate 104, as shown in FIGS. 4A and 5. Optionally, the spacers 106_1 and 106_2 may be formed in sequence on the opposite sides of the gate 104, as shown in FIG. 4B. The spacers 106_1 and 106_2 may each have one or more layers, although FIG. 4B only shows that the spacer 106_1 has one layer while the spacer 106_2 has two layers. The spacers 106_1 and 106_2 may each comprise any material selected from a group consisting of silicon nitride, silicon oxide, silicon oxynitride, silicon carbide, fluoride-doped silicon glass, and any low-K dielectric material, or any combination thereof. Alternatively, the spacers 106_1 and 106_2 may each comprise any suitable material other than those described above. In an embodiment of the present disclosure, the spacer 106_1 may comprise silicon nitride and have a thickness of about 15 nm. The spacer 106_2 may comprise a silicon oxide layer of about 3 nm and a silicon nitride layer of about 20 nm.

Figure 6:
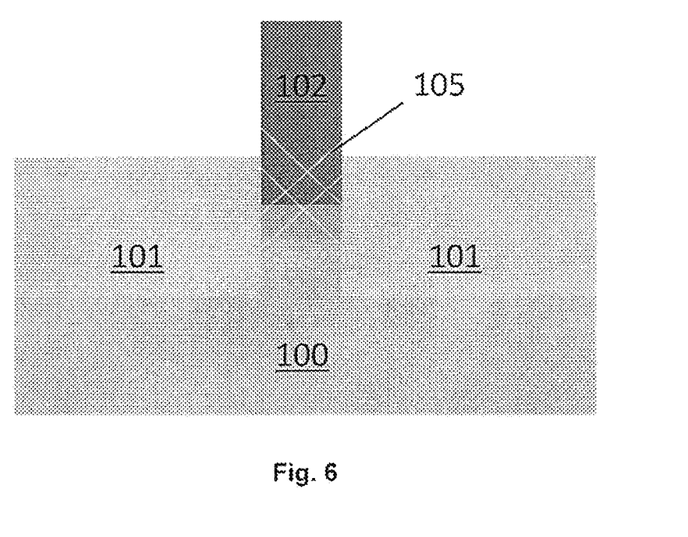

Then, ion implantation may be conducted to form source/drain regions of the FinFET on opposite ends of the fin. Optionally, light-doping implantation may be performed after the spacers 106_1 have been formed while before the spacers 106_2 are formed. When ion implantation and annealing are conducted for the source/drain regions, polycrystalline boundaries and dislocation lines 105 may be generated in the fin 102, as shown in FIG. 6.

A P-type or N-type dopant or impurity may be implanted into the substrate according to a desired structure of the transistor to form the source/drain regions. The dopant may be activated by annealing.

Figure 7:
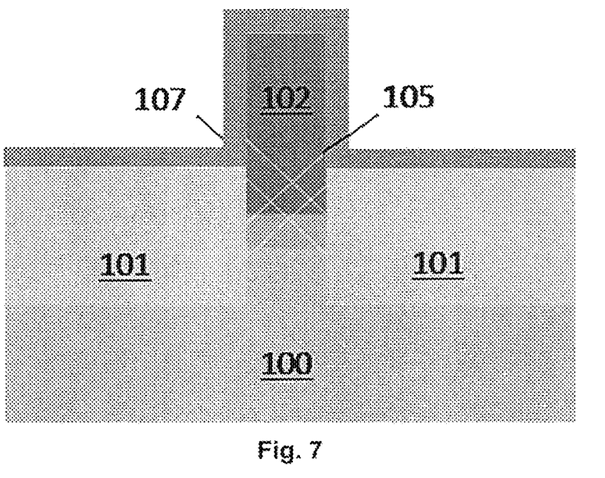

Next, in step S02, a Ti metal layer 107 is deposited, as shown in FIG. 7.

In an embodiment of the present disclosure, the Ti metal layer 107 may be deposited using a physical vapor deposition (PVD) process, for example, vacuum evaporation, sputtering, ion plating, or the like.

When the Si substrate is exposed to the air, the Si on the surface of the substrate 100 will react with $O_2$ to generate a compact native oxide layer $SiO_2$, which must be removed to deposit the metal layer on the Si surface. In an embodiment of the present disclosure, the native oxide layer on the surface of the fin 102 is removed before the Ti metal layer 107 is deposited.

In a specific embodiment, the device obtained in step S01 may be immersed in an HF chemical reagent to remove the native oxide layer from the surface of the fin 102. Then, the Ti metal layer 107 is deposited using PVD. The Ti metal layer 107 may be of a thickness of 4-10 nm.

Figure 8:
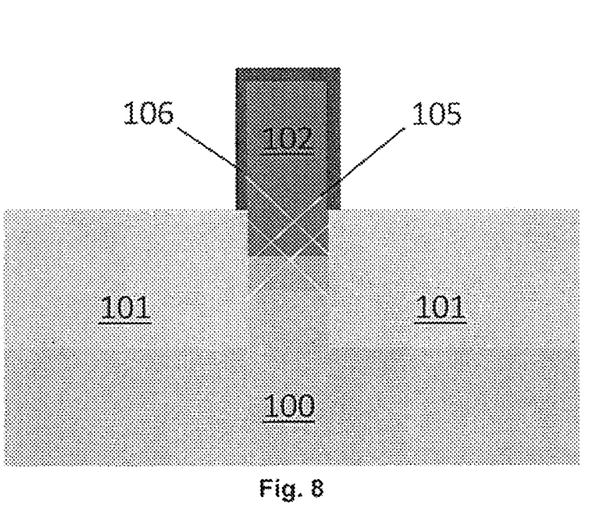

Then, in step S03, the Ti metal layer 107 is siliconized and unreacted Ti metal layer 107 is removed, as shown in FIG. 8.

The metal Ti has stable characteristics. In the siliconizion process, atoms that diffuse at a contact surface between Si and Ti are mostly Si atoms rather than Ti atoms. The Ti atoms do not diffuse along the original dislocation lines in the Si substrate, and thus are relatively stable. Therefore, current leakage in a depletion region due to metal diffusion can be avoided, whereby reducing leakage current in a channel region.

In an embodiment of the present disclosure, the metal siliconizion process is conducted by annealing, for example, Rapid Thermal Annealing (RTA), laser annealing, or microwave annealing, or the like. The annealing may be conducted one or more times. Specifically, two annealing processes are conducted in the present disclosure. The second RTA is conducted at a temperature higher than that for the first RTA to improve electrical performances of the TiSi$_2$ 106. In some embodiments, the first RTA is conducted at the temperature of 600-700° C. for 20-40 seconds to facilitate reaction between Si and Ti to form a high-resistivity C49 phase. The second RTA is conducted at the temperature of 800-900° C. for 7-13 seconds to facilitate conversion from the high-resistivity C49 phase TiSi$_2$ 106 into a low-resistivity C54 phase TiSi$_2$ 106, so as to reduce the resistivity of the formed TiSi$_2$ 106.

After the first RTA is conducted, a part of the deposited Ti metal layer 107 may react with the Si to generate the TiSi$_2$ 106, and the remaining part is still in a form of simple substance Ti. The unreacted Ti metal layer 107 may be removed using wet etching or dry etching. The unreacted Ti metal layer 107 can be completely removed using an etching process in which an etching rate for Ti is higher than that for TiSi$_2$, so as to form a Ti silicide on the source/drain regions of the fin, as shown in FIG. 8.

In a specific embodiment, a first RTA process is conducted on the substrate 100 having the Ti metal layer 107 deposited thereon at an annealing temperature of 650° C. for 30 seconds. Then, the entire unreacted Ti metal layer 107 is removed by wet chemical etching using ammonium hydroxide and hydrogen peroxide. The remaining TiSi$_2$ 106 covers the surface of the source/drain regions. A second RTA process is conducted at an annealing temperature of 850° C. for 10 seconds, to facilitate conversion from the high-resistivity C49 phase TiSi$_2$ 106 into the low-resistivity C54 phase TiSi$_2$ 106.

In the present embodiment, the method for forming the silicide is compatible with the method for self-aligning silicide. As the TiSi$_2$ 106 is only formed on the surface of the source/drain regions and the remaining Ti metal layer 107 does not react with the isolation layer 101, the remaining Ti metal layer 107 is removed completely by wet chemical etching.

In this way, the metal silicide according to an embodiment of the present disclosure is formed. With the method for forming the metal silicide according to the present disclosure, the problem in the conventional process for forming a Ni (Pt) silicide 110 that a large leakage current occurs between the fin 102 and the substrate 100 due to diffusion of Ni (Pt) 1701 along the dislocation lines 105 can be effectively solved. At the same time, parasitic resistance of the source/drain regions can be reduced by self-aligning the Ti silicide because the TiSi$_2$ 106 has a low resistivity.

Generally, the parasitic resistance of the source/drain regions can be reduced by a GeSi epitaxial layer on the source/drain regions to increase conductivity thereof. With continuous increase in the complexity of selective epitaxy of the source/drain regions of the FinFET structure, the difficulty and cost of the process also increase. In the method according to an embodiment of the present disclosure, the metal silicide layer comprising the Ti silicide has a low parasitic resistance, and thus may replace the epitaxial GeSi layer on the source/drain regions to reduce the parasitic resistance thereof. Therefore, the process can be simplified because it is unnecessary to form the GeSi epitaxial layer.

Figure 9:
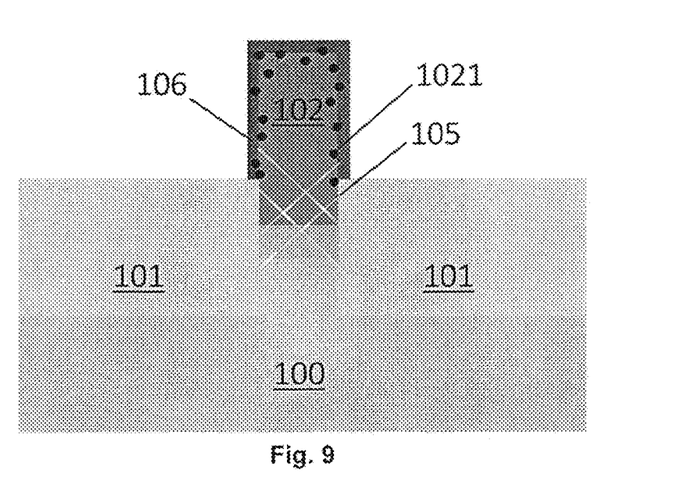

In addition, in order to further reduce the parasitic resistance of the source/drain regions and improve the performance of the FinFET device, ion implantation is conducted with a dopant 1021 after the Ti silicide is formed and then annealing is conducted. The type of the implanted dopant is the same as that for the source/drain regions.

In a specific embodiment, for an N-type device, the implanted dopant 1021 is a donor dopant with an implantation dosage in a range of 1E14 cm$^{-2}$ to 5E14 cm$^{-2}$. The ion implantation is conducted with implantation energy in a range of 5 to 15 KeV and at an implantation angle in a range of 0° to 45° with respect to a direction perpendicular to the fin. For a P-type device, the implanted dopant 1021 is an acceptor dopant with an implantation dosage in a range of 1E14 cm$^{-2}$ to 5E14 cm$^{-2}$. The ion implantation is conducted with implantation energy in a range of 2.5 to 10 KeV and at an implantation angle in a range of 0° to 45° with respect to a direction perpendicular to the fin.

The ion implantation is conducted twice. When the ion implantation is conducted at one side of the protruded fin at an implantation angle, ion implantation cannot be conducted at the other side of the fin due to blockage of the fin. Therefore, after the ion implantation is conducted at the one side of the fin, the ion implantation is conducted again at the other side of the fin at the same implantation angle with the same process parameters.

After the ion implantation is conducted, ions of the implanted dopant 1021 are driven to aggregate at a contact surface between the silicide and Si by means of RTA or the like, to increase doping concentration of the silicide and Si at the contact surface, thereby reducing contact resistance between the silicide and the source/drain regions to reduce the parasitic resistance of the source/drain regions, as shown in FIG. 9.

In a specific embodiment, the ion implantation is conducted twice at opposite sides of the fin 102 by the same implantation process. For the N-type device, the implanted dopant 1021 is As with an implantation dosage of 1E14 cm$^{-2}$. The ion implantation is conducted with implantation energy of 5 KeV at an implantation angle of 30° with respect to a direction perpendicular to the fin. For the P-type device, the implanted dopant 1021 is BF$_3$ with an implantation dosage of 1E14 cm$^{-2}$. The ion implantation is conducted with implantation energy of 3.5 KeV at an implantation angle of 30° with respect to a direction perpendicular to the fin.

Then, the RTA process is conducted on the substrate 100 at an annealing temperature of 650° C. for 30 seconds.

In the process of annealing, as the implanted dopant 1021 has a low solubility in the silicide, the implanted dopant 1021 aggregates near the contact surface between the silicide and Si, which increases the doping concentration of the silicide and Si at the contact surface. As a result, the contact resistance between the silicide and Si is reduced, thereby reducing the parasitic resistance of the source/drain regions. In this way, the electrical performance of the device can be improved.

Figure 10:
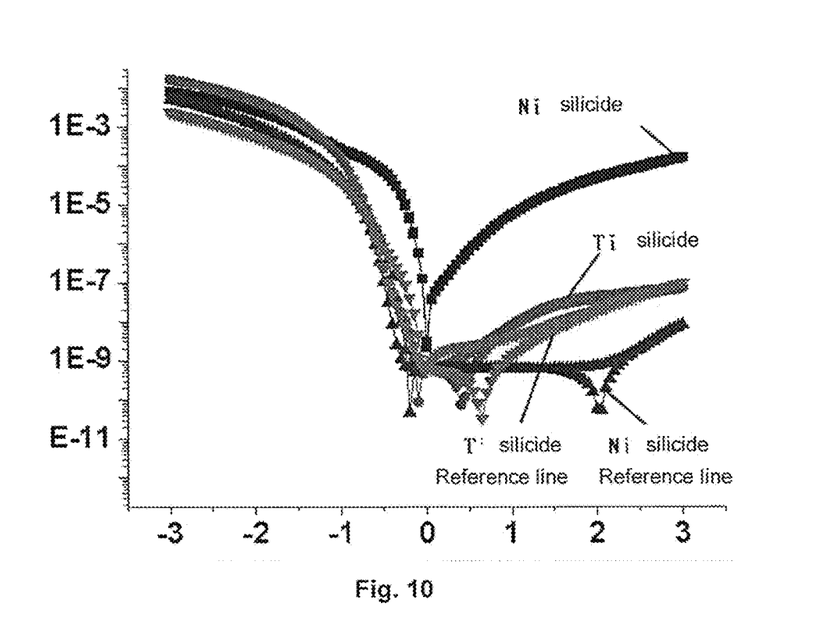
FIG. 10 shows an I-V curve between a drain and bulk silicon of the FinFET formed using the method according to an embodiment of the present disclosure.

Compared with the silicide formed using the conventional method for forming Ni(Pt) metal silicide, the metal silicide formed using the method for forming Ti metal silicide according to an embodiment of the present disclosure improves the performance of the FinFET. FIG. 10 illustrates respective I-V curves between the drain and the bulk Si under various working voltages in a NiSi device formed using the conventional method and the TiSi$_2$ device formed using the method according to an embodiment of the present disclosure. It can be seen that the leakage current between the drain and bulk Si in the NiSi device formed using the conventional method is two orders of magnitude greater than that in the TiSi$_2$ device formed using the method according to an embodiment of the present disclosure. The method for forming the metal silicide according to embodiments of the present disclosure effectively solves the problem related to the large leakage current between the fin and the bulk Si in the conventional process for forming the metal silicide in the FinFET.

Although the present disclosure has been described above with reference to preferable embodiments, the preferable embodiments are not intended to limit the present disclosure. Many possible variations and modifications can be made to the technical solutions of the present disclosure or changes can be made to the technical solutions of the present disclosure to obtain equivalent embodiments by any skilled person in the art using the method and technical contents described above without departing from the scope of the technical solutions of the present disclosure. Therefore, any simple change, equivalent variation, or modification made to the above embodiments according to the technical spirit of the present disclosure without departing from the contents of the technical solutions of the present disclosure should fall within the protection scope of the technical solutions of the present disclosure.

We claim:

1. A method for forming a metal silicide, comprising: providing a substrate, wherein the substrate contains silicon; forming a fin by etching the substrate; forming a gate on the fin;
    forming source and drain regions by doping in portions of fin on opposite sides of the gate;
    depositing a titanium (Ti) metal layer directly on a top portion and a plurality of side portions the portions of the fin;
    siliconizing the Ti metal layer by reaction between the Ti metal and the silicon in the fin to form a silicide;
    conducting ion implantation in the silicide with a dopant of the same type as that for the source or drain region and conducting an annealing for aggregating ions of the dopant at contact surfaces between the silicide and the fin: and removing unreacted Ti metal layer.

2. The method according to claim 1, wherein the siliconizing the Ti metal layer and removing the unreacted Ti metal layer comprises:
    conducting a first thermal annealing;
    removing the unreacted Ti metal layer; and
    conducting a second thermal annealing at a temperature higher than that for the first thermal annealing.

3. The method according to claim 2, wherein the first thermal annealing is conducted at the temperature of 600-700° C. for 20-40 seconds.

4. The method according to claim 3, wherein the second thermal annealing is conducted at the temperature of 800-900° C. for 7-13 seconds.

5. The method according to claim 1, wherein the dopant is As for an N-type device.

6. The method according to claim 1, wherein the ion implantation is conducted with an implantation dosage in a range of 1E14 cm$^{-2}$ to 5E14 cm$^{-2}$ and implantation energy in a range of 5 KeV to 15 KeV, and at an implantation angle in a range of 0° to 45° with respect to a direction perpendicular to the fin.

7. The method according to claim 1, wherein the dopant is BF$_3$ for a P-type device.

8. The method according to claim 7, wherein the ion implantation is conducted with an implantation dosage in a range of 1E14 cm$^{-2}$ to 5E14 cm$^{-2}$ and implantation energy in a range of 2.5 KeV to 10 KeV, and at an implantation angle in a range of 0° to 45° with respect to a direction perpendicular to the fin.

9. The method according to claim 1, wherein, the further annealing is conducted at a temperature of 550-700° C. for 20-40 seconds.

* * * * *